United States Patent [19]

Nishimura et al.

[11] Patent Number: 4,861,418
[45] Date of Patent: Aug. 29, 1989

[54] METHOD OF MANUFACTURING SEMICONDUCTOR CRYSTALLINE LAYER

[75] Inventors: Tadashi Nishimura; Yasuo Inoue; Kazuyuki Sugahara; Shigeru Kusunoki, all of Hyogo, Japan

[73] Assignee: Kozo Iizuka, Director General, Agency of Industrial Science and Technology, Tokyo, Japan

[21] Appl. No.: 22,402

[22] Filed: Mar. 6, 1987

[30] Foreign Application Priority Data

Mar. 7, 1986 [JP] Japan .................. 61-48468

[51] Int. Cl.$^4$ ............................................ C30B 13/22
[52] U.S. Cl. .................. 156/620.72; 156/610; 156/613; 156/614; 156/626.7; 156/DIG. 64; 156/DIG. 80
[58] Field of Search ........... 156/610, 613, 614, 617 R, 156/DIG. 64, DIG. 80, 620.7, 620.72; 427/93

[56] References Cited

U.S. PATENT DOCUMENTS

| | | | |
|---|---|---|---|
| 4,371,421 | 2/1983 | Fan et al. | 156/DIG. 88 |
| 4,448,632 | 5/1984 | Akasaka | 156/DIG. 64 |
| 4,479,846 | 10/1984 | Smith et al. | 156/DIG. 73 |
| 4,494,300 | 1/1985 | Schwuttke et al. | 156/DIG. 80 |
| 4,565,584 | 1/1986 | Tamura et al. | 156/DIG. 80 |
| 4,590,130 | 5/1986 | Cline | 428/446 |

FOREIGN PATENT DOCUMENTS

| | | | |
|---|---|---|---|
| 59-45996 | 3/1984 | Japan | 156/614 |
| 59-108313 | 6/1984 | Japan | 156/610 |
| 2153252 | 8/1985 | United Kingdom | 156/617 R |

OTHER PUBLICATIONS

Lam et al., "Single Crystal Silicon-on-Oxide by a Scanning CW Laser Induced Lateral Seeding Process", Journal Electrochemical Society, Sep. 1981, pp. 1981-1986.

Colinge et al., "Use of Selective Annealing for Growing Very Large Grain Silicon on Insulator Films", Appl. Phys. Lett. 41 (4), Amer. Institute of Physics, Aug. 15, 1982, pp. 346-347.

Primary Examiner—Robert L. Stoll
Assistant Examiner—Robert M. Kunemund
Attorney, Agent, or Firm—Bernard, Rothwell & Brown

[57] ABSTRACT

A method of manufacturing a semiconductor crystalline layer comprising the following steps: a step of forming, on a single crystalline substrate composed of a semiconductor having a main face on <001> face and having a diamond-type crystal structure, an orientation flat face in which the direction of the intersection with the main face makes a predetermined angle relative to the direction <110> on the main face and which serves as a reference for defining the direction of arranging semiconductor chips formed on the substrate; a step of forming, on the main face of the substrate, an insulation layer at least a portion of which has an opening reaching the main face and which insulates the substrate at the region other than the opening; a step of forming a semiconductor layer composed of a polycrystalline or amorphous semiconductor on the surface of the opening and the insulation layer; a step of forming a reflectivity varying layer which is in the direction in parallel with or vertical to the intersection between the orientation flat face and the main face, has the width and the distance in a predetermined period and is set so as to show periodical reflectivity variation to the argon laser beams; and a step of scanning the argon laser beams under continuous irradiation by way of the reflectivity varying layer to the semiconductor layer in the direction identical with or at an angle within a certain permissible range to the direction <110> of the main face or the direction equivalent thereto.

8 Claims, 8 Drawing Sheets

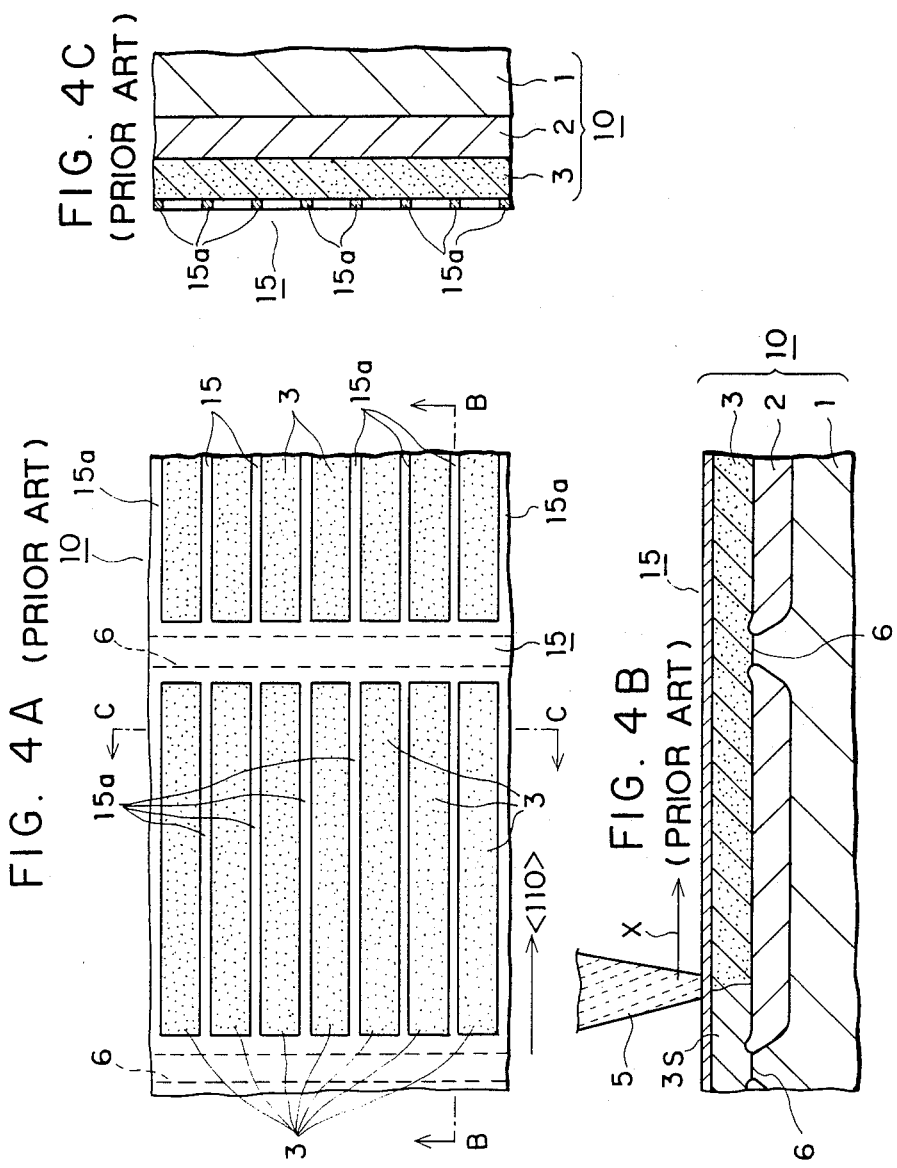

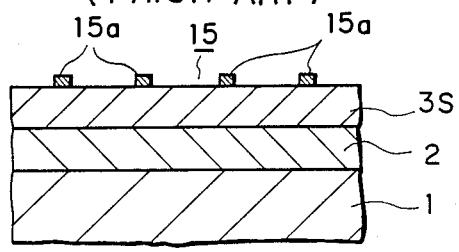
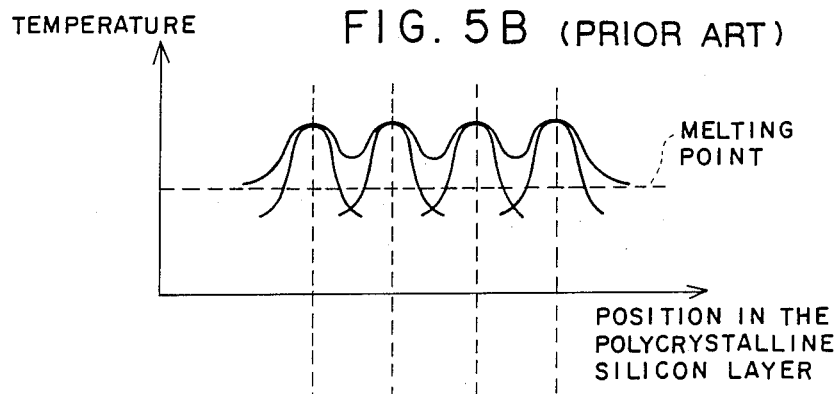
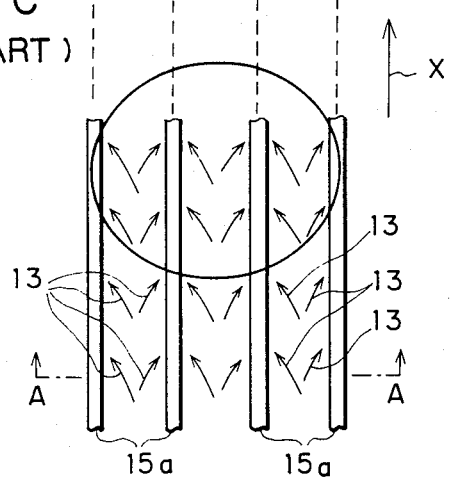

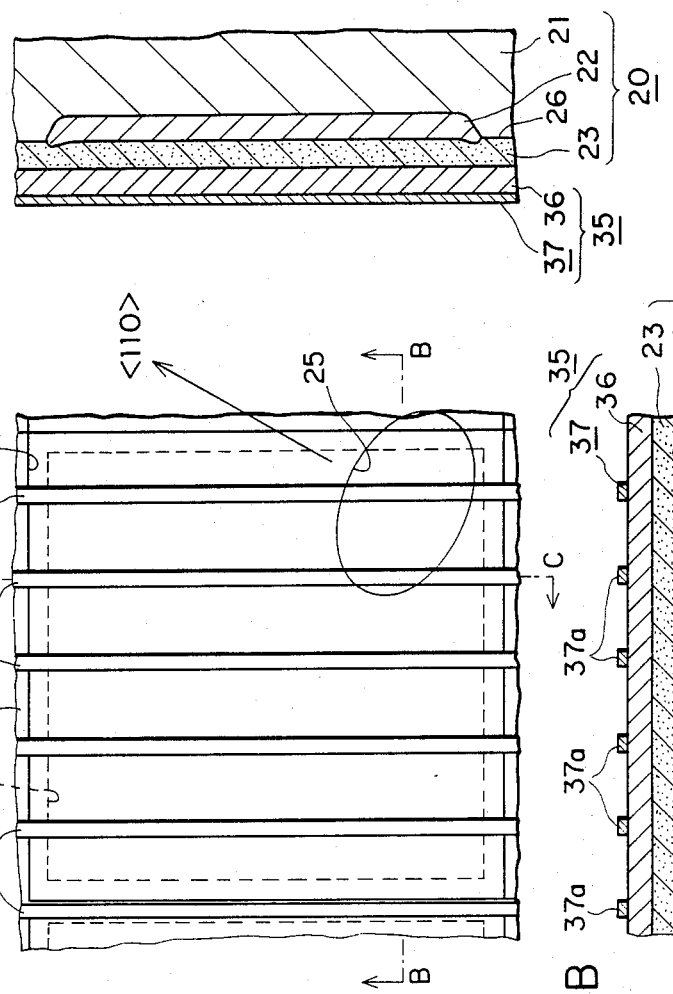

METHOD OF MANUFACTURING SEMICONDUCTOR CRYSTALLINE LAYER

BACKGROUND OF THE INVENTION

1. Field of the Invention

This invention concerns a method of manufacturing a semiconductor crystalline layer and, more particularly, it relates to a method of manufacturing a semiconductor crystalline layer, which comprises forming a polycrystalline or amorphous semiconductor layer on a substrate in which a relatively thick insulation layer is formed on one main surface of semiconductor single crystals, melting the semiconductor layer by scanning continuously oscillating laser beams, for example, argon laser beams to the semiconductor layer and thereby forming a semiconductor single crystalline layer on the insulation layer from the underlying semiconductor crystals as the seeds.

2. Description of the Prior Art

Various improvements and studies have been made generally for semiconductor integrated circuits (IC) for reducing the size, simplifying the structure and improving the performance of various equipments. However, there is an inevitable limit to the technique for integrating such semiconductor devices at high density on a plane, that is, in a 2-dimensional manner. In view of the above, research and development have been conducted for semiconductor devices having features in the 3-dimensional structure in recent years. As the basis for the development of such 3-dimensional semiconductor devices, various developments have been attempted to the techniques for forming semiconductor crystalline layer on one main surface of semiconductor single crystals as the seeds.

FIG. 1 shows one example of conventional methods for growing a semiconductor crystalline layer as shown in the descriptions of "Single Crystal Silicon-on-Oxide by a Scanning CW Laser Induced Lateral Seeding Process" (presented by H. W. Lam, R. F. Pinizzotto and A. F. Tasch, Jr.) disclosed in "J. Electrochem Soc.: SOLID-STATE SCIENCE AND TECHNOLOGY" September 1981, pp 1981–1986.

In the figure, a structure comprising a single crystalline silicon substrate 1 having {100} face [(001) face or crystal face equivalent thereto] as the main surface (hereinafter simply referred to as a silicon substrate), a relatively thick oxide insulation layer 2 composed of a silicon dioxide membrane formed on one main face of the silicon substrate 1 and a polycrystalline silicon layer 3 formed on the oxide insulation layer 2 by way of chemical vapor deposition process (hereinafter simply referred to as CVD process) is used as the substrate in the manufacture of single crystalline membrane. The single crystalline silicon layer 3S is formed by scanning the continuously oscillating laser beams 5 relative to the polycrystalline silicon layer 3 while irradiating them and scanning in the direction of the arrow X and melting and recrystallizing the polycrystalline silicon layer 3. Accordingly, the single crystalline silicon layer 3S is formed into single crystals along the direction of the main face of the silicon substrate 1.

FIGS. 2A through 2D are cross sectional views illustrating the manufacturing steps of a semiconductor employed as a substrate in the conventional manufacturing step for a single crystal membrane. Explanation will be made to the method of manufacturing a semiconductor device used as the substrate while referring to FIGS. 2A through 2D.

In FIG. 2A, the silicon substrate having {100} face as the main face is at first exposed to an oxidizing atmosphere at 950° C. to form thermally oxidized membrane 7 of 500 Å thickness on the main face and then a silicon nitride membrane 8 is formed to a thickness of about 1000 Å by using CVD process.

In FIG. 2B, the silicon nitride membrane 8 was removed while leaving only those portions corresponding to the opening on the silicon substrate 1, eliminating other portions of the silicon nitride membrane by means of photolithography and etching.

In FIG. 2C, the exposed thermally oxidized membrane 7 is removed by using the patterned silicon nitride membrane 8 as a mask and, further, the surface of the silicon substrate 1 is eliminated by about 5000 Å through etching. Then, by exposing the silicon substrate 1 to an oxidizing atmosphere at 950° C. for a long time, an oxide insulation layer 2 composed of silicon dioxide of about 1 μm thickness is grown on a predetermined region.

In FIG. 2D, the silicon nitride membrane 8 left at the surface of the silicon substrate 1 and the thermally oxidized membrane 7 therebelow are eliminated, and a polycrystalline silicon layer 3 is grown to a thickness of about 7000 Å by using a CVD process. In this way, there is formed a substratum 10 comprising the silicon substrate 1 having {100} face as the main face, a thick oxidized insulation layer 2 formed on the silicon substrate 1 and having the opening 6 reaching the underlying silicon substrate at least to a portion thereof and the polycrystalline layer 3 formed on the opening 6 and the oxidized insulation layer 2.

Then, description will be made of the method of forming a single crystalline silicon layer on an oxidized membrane (insulation membrane) using the substratum 10 formed by the steps shown from FIG. 2A through FIG. 2D while referring to FIG. 1.

As shown in FIG. 1, by melting the polycrystalline silicon layer 3 above the opening 6 by the irradiation of the laser beams 5 and extending the melting to the surface of the silicon substrate 1 below the opening 6, epitaxial growing results from the single crystals in the underlying silicon substrates as the seeds upon recrystallization to reform the polycrystalline silicon layer 3 into single crystal. Accordingly, upon melting the polycrystalline silicon layer 3 by scanning the laser beams 5 in the direction of the arrow X in FIG. 1, epitaxial growing results continuously in the lateral direction, that is, in the scanning direction of the laser beams 5 thereby enabling to growth of the single crystalline layer 3S on the oxidized insulation layer 2 as the insulation layer.

However, in the method of forming the single crystalline silicon layer, there is a problem that the power distribution of the laser beams 5 has an extremely significant effect on the melting and recrystallization in the polycrystalline silicon layer 3.

FIGS. 3A and 3B are views illustrating the power distribution of the laser beams used for melting the polycrystalline silicon layer, as well as the solid-liquid boundary and the crystal growing direction upon melting the polycrystalline silicon. More specifically, FIG. 3A shows the power distribution characteristics of the laser beams, while FIG. 3B shows the crystal growing direction of the polycrystalline silicon layer on a plane.

As shown in FIG. 3A, the power distribution of the laser beams 5 used for melting the polycrystalline silicon layer 3 forms a so-called Gaussian type distribution in which the power is higher at the lateral center of the beams and lower at the peripheral area in the lateral direction perpendicular to the scanning direction of the laser beams shown by the arrow X. Accordingly, in the case where the polycrystalline silicon is melted and then recrystallized, solidification starts from the periphery of the molten portion at low temperature and the crystal growth prevails toward the center of the molten portion at high temperature. Accordingly, as shown in FIG. 3B, crystal growth from various crystal nuclei at the periphery of the beam width results at the solid-liquid boundary 12. As a result, since the crystal growing directions 13 are not constant and the epitaxial crystal growth along the face direction of the main face of the silicon substrate 1 is hindered, the region in which the grown layer of the single crystal silicon 3S is obtained has been restricted to 50 or 100 μm from the end of the opening 6 in the conventional method as described above.

In order to overcome the foregoing problems, an attempt has been made to extent the distance of the epitaxial crystal growth by forming stripe-like reflection preventive membranes on the upper portion of the polycrystalline silicon layer 3, resulting in a periodic temperature distribution in the lateral direction (relative to the laser scanning direction shown by the arrow X) within the polycrystalline silicon layer 3 upon irradiation of the laser beams.

As an example of the method of growing single crystal while controlling the temperature distribution of the laser beams by the use of the reflection preventive membrane as described above, there has been disclosed "Use of selective annealing for growing very large grain silicon on insulator films" [Appl. Phys. Lett. 41(4), Aug. 15, 1982, pp 346–347] presented by J. P. Colinge, et al in "American Institute of Physics 1982". In this literature, the temperature distribution of the spot laser is shown in FIG. 1 and the photograph showing the reflection preventive membrane and the manner of crystal growth is shown in FIG. 2 respectively. As another example different from that described in the foregoing proceedings, there can be mentioned "Method of manufacturing a semiconductor single crystalline layer" filed by one of the present inventors on Dec. 13, 1982 to Japanese Patent Office and laid-open by the director general of Japanese Patent Office on June 22, 1984 (Japanese Patent Laid-Open No. Sho 59-108313).

FIGS. 4A through 4C show the details of the latter prior art. In the drawings, parts and portions identical with those in FIGS. 1, 2, 3A and 3B are represented by identical reference numerals.

Stripe-like reflection preventive membrane 15 having stripe portions 15a the longitudinal direction of which extend in <110> direction or the direction equivalent thereto are formed on a polycrystalline silicon layer. The reflection preventive membrane 15 has a function of preventing laser beams from reflecting in the region and making the temperature of the polycrystalline silicon layer 3 below the region in which the stripe portions 15a are formed higher than the temperature of the polycrystalline silicon layer 3 at the region in which no stripe portions 15a of reflection preventive membrane are formed. By disposing such reflection preventive membrane 15, a periodic temperature distribution as shown in FIG. 5B can be formed within the polycrystalline silicon layer 3 upon irradiating the laser beams 5. In FIG. 5B, the abscissa represents the position in the polycrystalline silicon membrane and the ordinate shows the temperature upon irradiating the laser beams.

When the stripe-like reflection preventive membrane 15 are disposed and the laser beams 5 are irradiated along the longitudinal direction of the stripe portions 15a of the reflection preventive membrane 15 while scanning them along the direction of the arrow X, since a periodic temperature distribution is formed along the lateral direction (relative to the scanning direction of the laser beams) in the polycrystalline silicon layer 3, the crystal growing directions 13 are directed from the center of the region in which no stripe portions 15a of the reflection preventive membrane 15 are formed to the region of the polycrystalline silicon layer 3 in which the stripe portions 15a of the reflection preventive membrane 15 are formed. Since the reflection preventive membrane 15 reaches as far as the opening 6, the epitaxial growth from the underlying substrate single crystal below the opening 6 as the seeds continuously occurs from the opening 6 to the polycrystalline silicon layer 3 at a low temperature on the oxidized insulation layer 2. Accordingly, for the growth of the recrystallized silicon layer 3S on the oxidized insulation layer 2, epitaxial crystal growth results only along the phase direction of the underlying silicon substrate 1 from the opening 6 and, as a result, the crystal growing direction is made constant (uni-direction) and the single crystal growing direction can be increased.

However, also in this case, although the crystal growing distance can be extended in the case where the scanning speed of the laser beams 5 is from 1 to 5 cm/sec, if the scanning speed of the laser beams 5 is increased to 20 or 30 cm/sec in order to increase the output (processing amount), the single crystal growing distance is restricted to about 200 μm from the end of the opening 6.

In a conventional silicon wafer used as the silicon single crystal substrate 1, since the orientation flat face for the detection of the position is disposed to the (110) face, all of the patterns formed on the wafer (patterns for the chip arranging direction, circuit elements formed on the chips) are restricted to the directions parallel with or perpendicular to the <110> direction, that is, the intersecting direction between the orientation flat face and the silicon wafer or the direction equivalent thereto and, accordingly, the longitudinal direction of the stripe of the reflection preventive membrane 15 is also restricted to the direction parallel with the <110> direction or the direction equivalent thereto. Accordingly, in the case of scanning the laser beams 5 in the <110> direction or the direction equivalent thereto, the actual crystal growing direction determined by the temperature distribution set by the stripe of the reflection preventive membrane 15 is greatly different from <110> direction which is the scanning direction of the laser beams 5. Thus, it is greatly deviated also from {111} face in which stabilized crystal growth is obtained. In the case where the scanning speed for the laser beams 5 is slow, since the transition region for the actual melting-solidification to the deviation between the crystal growing face and {111} face is broad, the range capable of allowing the deviation is also extended. However, in the case where the scanning speed for the laser beams 5 is high, the range capable of allowing the deviation is narrower resulting in crystal defects such as laminar defects and thereby resulting in crystal boundary subsequently.

Accordingly, there has been a problem that no long single crystal growing can be obtained in the recrystallized single crystalline silicon layer.

SUMMARY OF THE INVENTION

An object of this invention is to provide a method of manufacturing a semiconductor crystalline layer capable of giving single crystal growing for a semiconductor layer with no crystal defects in the case where the scanning speed for the laser beams is high and capable of obtaining a single crystal semiconductor layer at high quality and with a large area.

In order to attain the foregoing object, the method of manufacturing the semiconductor crystalline layer according to this invention comprises steps of forming on a semiconductor single crystalline substrate having (001) face or crystal face equivalent thereto as a main face and having a diamond type crystal structure, an orientation flat face in which the direction of the intersection with the main face makes a certain angle and which determines the direction of arranging semiconductor devices arranged on the substrate, then forming a stripe-like reflection membrane or reflection preventive membrane by way of a polycrystalline or amorphous silicon layer in the direction parallel with or perpendicular to the intersection between the orientation flat face and the main face and then irradiating argon laser beams while scanning in the direction <110> or the direction equivalent thereto to the polycrystalline or amorphous silicon layer.

BRIEF DESCRIPTION OF THE DRAWINGS

FIG. 4A is a schematic plan view showing a substrate and reflection preventive membrane disposed to the substrate in a somewhat improved conventional method for manufacturing a semiconductor single crystalline layer;

FIG. 4B is a cross sectional view taken along line B—B in FIG. 4A and viewed from the front;

FIG. 4C is a cross sectional view taken along line C—C in FIG. 4A;

FIG. 5A is a cross sectional view showing a recrystallized silicon layer formed into single crystal, an oxidized insulation layer, a silicon substrate and reflection preventive membrane;

FIG. 5B is characteristic chart showing the power distribution of laser beams that irradiate the silicon layer to be formed into single crystals shown in FIG. 5A;

FIG. 5C is a schematic plan view showing the crystal growing direction and the scanning direction of the laser beams upon melting-solidification of the silicon layer formed into single crystal;

FIG. 7A is an enlarged plan view showing the chip region of the wafer shown in FIG. 6A;

FIG. 7B is a cross sectional view taken along line B—B in FIG. 7A; and

FIG. 7C is a cross sectional view taken along line C—C in FIG. 7A;

DETAILED DESCRIPTION OF THE PREFERRED EMBODIMENTS

Figure 1:
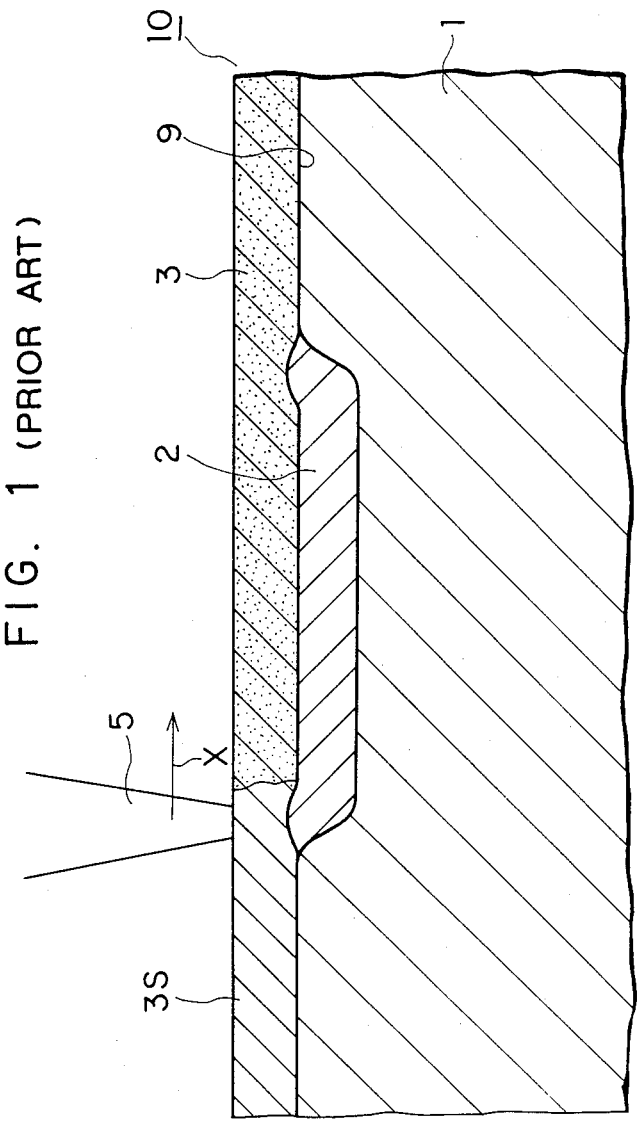
FIG. 1 is an enlarged cross sectional view for one example of a semiconductor device formed by the conventional method for manufacturing a semiconductor single crystal layer.
Figure 2A:
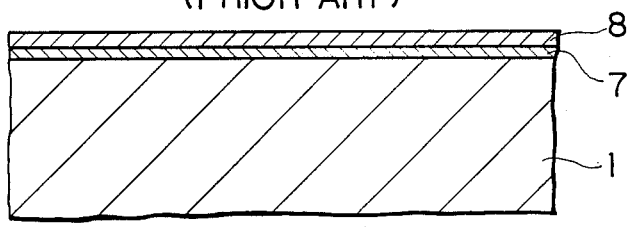
FIGS. 2A through 2D are, respectively, cross sectional views showing the semiconductor device in each of the manufacturing steps in the method of manufacturing the semiconductor single crystalline layer in FIG. 1.
Figure 2B:
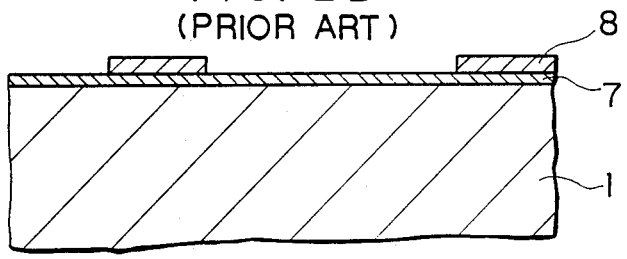
Figure 2C:
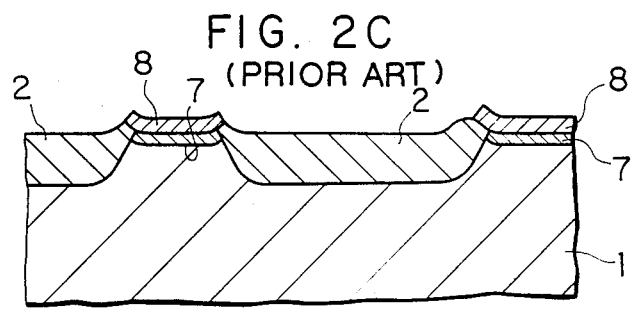
Figure 2D:
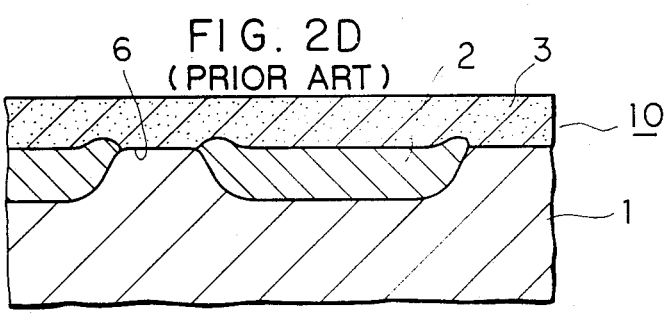
Figure 3A:
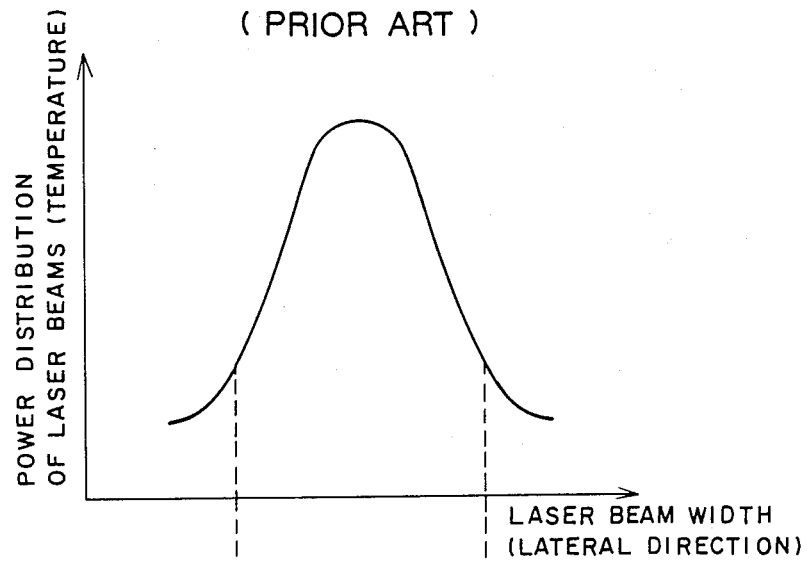
FIG. 3A is a characteristic chart showing the power distribution of laser beams used for melting the polycrystalline or amorphous semiconductor layer.
Figure 3B:
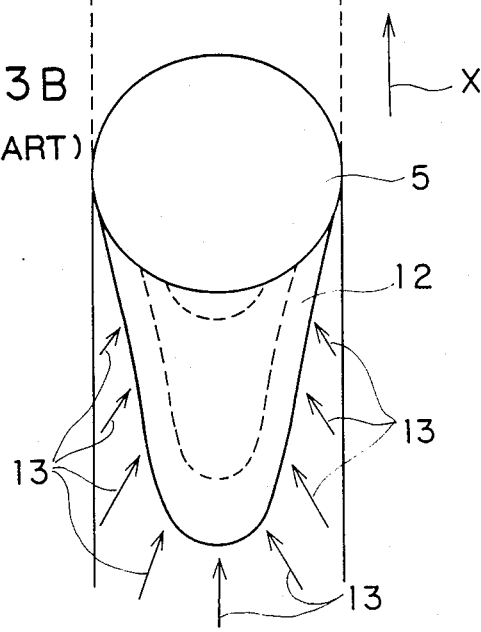
FIG. 3B is a schematic plan view showing the solid-liquid boundary and the crystal growing direction which results in the polycrystalline or amorphous semiconductor layer by the irradiation of the laser beams having the power distribution shown in FIG. 3A.

This invention will now be described more in detail for preferred embodiments of the method of manufacturing semiconductor crystalline layer while referring to the drawings.

Figure 6A:
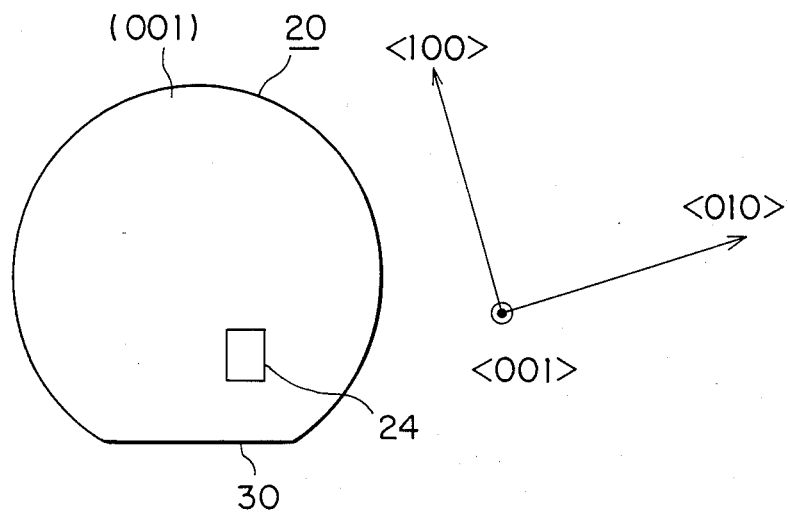
FIG. 6A is a plan view showing a silicon wafer as the semiconductor substrate used in one embodiment of the method of manufacturing a semiconductor crystalline layer according to this invention.
Figure 6B:
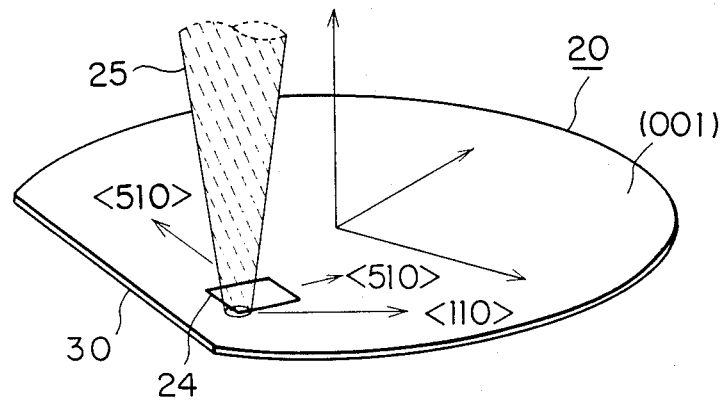
FIG. 6B is a schematic perspective view of the silicon wafer.

FIGS. 6A and 6B are, respectively, a plan view and a perspective view the showing the schematic constitution of a silicon wafer used as a substrate for a semiconductor device in one embodiment according to this invention.

Explanation will then be made of the constitution of a semiconductor device comprising, for example, a semiconductor wafer used as a substrate in one embodiment according to this invention while referring to FIGS. 6A and 6B.

In FIGS. 6A and 6B, semiconductor wafer 20 used as the substratum in the method of manufacturing a crystalline membrane as one embodiment according to this invention has a main face at (001) face or crystal face equivalent thereto [hereinafter referred to simply as (001) face] and an orientation flat face 30 for the detection of the direction is set to (510) face. A chip 24 is disposed on the silicon semiconductor wafer 20 such that the shorter or the longer side thereof is in parallel with the orientation flat face 30. Then, the constitution of individual semiconductor chips will be explained while referring to FIGS. 7A through 7C.

Figure 9:
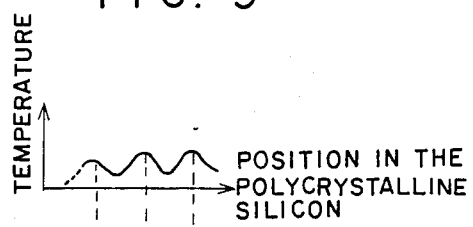
FIG. 9 is a characteristic chart showing the power distribution of argon laser beams irradiated to the silicon wafer in relation with FIGS. 8A through 8C.

The chip region 24a of the chip 24 is composed of silicon single crystalline substrate 21 having a main face at (001) face the region of which is defined by opening 26 as shown by the dotted line in FIG. 7A (hereinafter simply referred to as the silicon substrate), oxidized insulation layer 22 made of silicon dioxide formed on the substrate 21 with the opening 26, polycrystalline silicon layer 23 to be melted formed on the insulation layer 22 and the opening 26, silicon dioxide layer 36 of 2500 Å thickness formed on the polycrystalline silicon layer 23 and serving as reflection preventive membrane 35 to the argon laser beams 25 and stripe-like silicon nitride membranes 37 set on the silicon dioxide layer 36 with the longitudinal direction thereof being directed to (510) direction. The longitudinal direction of the stripe portion 37a of the stripe-like silicon nitride membrane 37 is set in the direction perpendicular to or parallel with the orientation flat face 30, that is, along the direction <510> with 550 Å of thickness, 10 μm of width and 5 μm of interval, periodically varies the reflectivity to the laser beams of the silicon dioxide layer 36 as the reflection preventive membrane 35 and provides a desired temperature distribution in the polycrystalline silicon layer 23 upon irradiation of the laser beams 25. The silicon dioxide layer 36 forming the reflection preventive membrane 35 is conditioned to the continuously oscillating argon laser beams 25 at the wavelength: λ=5145 Å and allows the argon laser beams 25 to pass therethrough substantially by 100%. Accordingly, in the foregoing constitution, the temperature of the polycrystalline silicon layer below the region in which stripe-like silicon nitride membrane 37 is formed is made higher than the temperature of the polycrystalline silicon layer 23 below the region in which no stripe portion 37a of the silicon nitride membrane 37 is formed, so that the temperature distribution of the laser beam power shown in FIG. 9 is formed in the polycrystalline silicon layer 23 upon irradiation of laser beams as described later. The direction of arranging the chip 24 is defined to the orientation flat face 30.

FIGS. 8A through 8C and FIG. 9 show the steps in the manufacturing process for the semiconductor crystalline layer in one embodiment according to this invention. Explanation will then be made to the method of manufacturing a semiconductor crystalline membrane as one embodiment of this invention while referring to FIGS. 8A through 8C and FIG. 9.

Figure 8A:
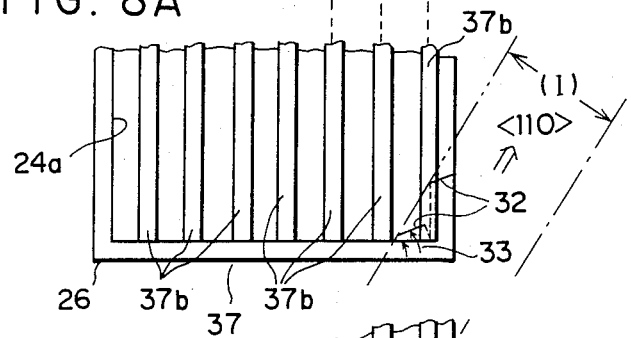
FIGS. 8A through 8C are, respectively, schematic plan views showing the manufacturing steps for forming single crystal silicon by melting and solidifying the polycrystalline silicon layer while irradiating argon laser beams to the semiconductor chip region shown in FIGS. 7A through 7C.

Referring at first to FIG. 8A, the argon laser - beams are scanned in the direction <110>. In this case, since the reflectivity to the argon laser beams 25 is periodically varied by the reflection preventive membrane 35 comprising the silicon dioxide membrane 36 and the silicon nitride membrane 37, the temperature distribution in the polycrystalline silicon layer 23 that absorbs the laser beams 25 upon irradiating the argon laser beams 25 is as shown in FIG. 9, in which the temperature of the polycrystalline silicon layer 23 below the region 37b in which the silicon nitride membranes 37 are formed is higher, while the temperature of the polycrystalline silicon layer 23 below the region in which the no silicon nitride membranes 37 are formed is lower. The temperature distribution in this case is shown while being positioned also to the upper portion in FIG. 8A. As a result, in the case where the reflection preventive membranes are formed under the foregoing condition, the solid-liquid boundary 32 in the laser beam irradiated region is different from the scanning direction of the argon laser beams 25 but is formed in a saw teeth-like shape as shown in FIG. 8A in which the main direction is <210> direction or <211> direction. In this case, the molten region causes epitaxial growth from the underlying single crystalline silicon substrate 21 as the seed crystals through the opening 26 (shown by the arrow 33). That is, when the argon laser beams are scanned and irradiated at a scanning speed of 25 cm/sec, and the polycrystalline silicon layer 23 is melted and recrystallized, it causes single crystal epitaxial growth in the direction <210> or <211> at a crystal growing rate inherent to the crystal face in the direction of the arrow 33 with no substantial relationship to the scanning speed and the direction of the laser beams.

Figure 8B:
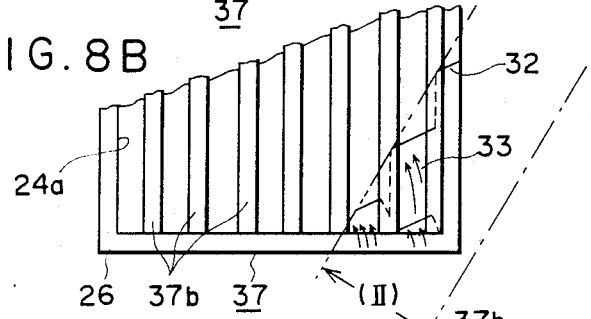

Second laser beam scanning will be explained while referring to FIG. 8B. When the first scanning (I) by the argon laser beams 25 has been completed, the argon laser beams 25 are displaced by about 30 μm in the direction perpendicular to the scanning direction and then irradiated again under scanning (II) in the direction <110>. The molten region by the second laser beam irradiation reaches the region melted by the former scanning of the laser beams, in which the epitaxial growth initiated from the underlying single crystalline substrate 23 as the seeds results in the area in communication with the opening 26 in the direction of the arrow 33 through the opening 26, the epitaxial growth results initiated from the single crystal grown region as the seed crystals while in the region in adjacent with the region put to single crystal growing by the first scanning (I) of the laser beams.

Figure 8C:
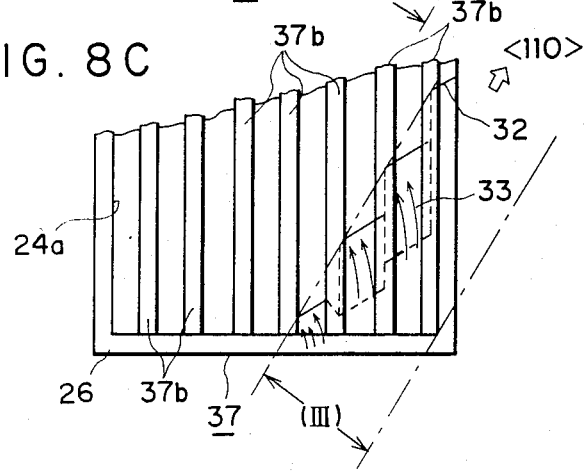

As shown in FIG. 8C, the third argon laser scanning (III) is conducted. Also in this case, epitaxial growth initiated from the underlying single crystalline substrate as the seed crystals and the epitaxial growth initiated from the region of single crystal growing by the former laser beam scanning as the seed crystals occur and the distance of the single crystal growing region is further increased.

By repeating the laser beam scanning hereinafter, the polycrystalline silicon layer 23 on the wafer 20 is formed into single crystals. In this case, the distance of the single crystal growth by the first laser beam scanning (I) is about 40 through 50 μm at the longest since it is different from the laser beam scanning direction. That is, since the crystal growing distance results along the longitudinal direction of the stripe at the small region between the solid-liquid boundary in the present scanning and the solid-liquid boundary in the former scanning at a crystallization rate inherent to the crystal face. Accordingly, although the scanning speed of the argon laser beams 25 is as high as 25 cm/sec, the single crystal growth itself results within an extremely finely divided region (the region between the solid-liquid boundary 32 in the present scanning and the solid-liquid boundary 32 formed by the former laser beam irradiation) at a crystal growing rate inherent to the crystal face. Accordingly, the component of the laser beam scanning speed in the crystal growing direction is eventually decreased thereby enabling the obtaining of a single crystalline layer of extremely excellent quality with no crystal defects (laminar defects, etc.) over a wide area. Further, since the single crystal growing distance by the laser beam scanning is as small as from 40 to 50 μm no distortion results due to the difference of the heat expansion coefficient between the single crystalline silicon layer and the underlying insulation layer, by which a high quality single crystalline layer can be obtained. Moreover, since the scanning speed of the argon laser beams is relatively fast, e.g., from 25 to 30 cm/sec, a single crystalline layer can be formed in a relatively short time over the entire surface of the wafer 20.

Although the reflection preventive membrane 35 is composed of the silicon dioxide membrane 36 of 2500 Å thickness, and the silicon nitride membrane 37 formed in the stripe-like shape of 550 Å thickness in the above-mentioned embodiment, this invention is no way limited only thereto and the same effects can also be attained by using the structure, for example, in which silicon nitride membrane of 400-800 Å thickness is formed in a stripe-like manner with the width of 8 to 15 μm and the interval of 4 to 7 μm on a silicon dioxide membrane of from 200 to 3000 Å thickness, or a structure in which silicon nitride membrane of 500 to 600 Å thickness is formed in a stripe-like manner with the width from 4 to 7 μm and the interval of 8 to 15 μm on a silicon dioxide membrane of 100 to 200 Å thickness and, further, a silicon nitride membrane of 60 to 150 Å thickness is further formed thereover. Further, in view of the function of the reflection preventive membrane, it will be apparent that various methods can be used so long as the structure can periodically vary the reflectivity to the laser beam wavelength. That is, the silicon nitride membranes may be formed in a stripe-like manner by only one layer. Alternatively, high melting metal or the silicide thereof may be formed in a stripe-like manner so as to directly reflect the laser beams by the region, instead of forming the reflection preventive membrane due to the variation in the refractive index. Further, it will be apparent that similar effects can also be obtained by forming stripe-like polycrystalline silicon membranes on the oxide insulation layer 22 so as to absorb the laser beams to the polycrystalline silicon membrane thereby lowering the temperature below the region where the stripe-like polycrystalline silicon membrane is formed.

Further, since the reflection preventive effect changes depending on the interval and the membrane thickness of the stripes of the reflection preventive membrane and the direction of the solid-liquid boundary of the polycrystalline silicon layer produced upon laser beam irradiation varies correspondingly, it is apparent that a better result can be obtained by properly adjusting the direction of the orientation flat face, that is, the stripe direction of the reflection preventive membrane and the scanning direction of the laser beams respectively depending on conditions such as the required pattern size or the like.

Further, although the opening 26 is formed to define the chip region 24a such that the single crystal growth can be attained from any of the regions in the above-mentioned embodiment, the direction and the shape of forming the opening 26 is not restricted only to that shown in the drawing. Further, it is not always necessary for the opening 26 to surround the chip region 24a.

Further, although the polycrystalline silicon layer is used as the semiconductor layer to be melted, similar effects can also be obtained by using amorphous silicon.

As has been described above according to this invention, since the orientation flat face is formed to the side of the single crystalline semiconductor wafer having the main face on the (001) face or the crystal face equivalent thereto such that the intersection with the main face makes an angle from 30° to 45° with respect to the direction <110> or the direction equivalent thereto, the longitudinal direction of the stripe of the stripe-like reflection membrane or reflection preventive membranes formed on the amorphous or polycrystalline semiconductor layer to be melted is aligned with the direction parallel with or perpendicular to the intersection between the orientation flat face and the main face of the single crystalline semiconductor wafer and the scanning direction of the argon laser beams for melting the polycrystalline or amorphous semiconductor layer is set in such a direction as make an angle within the range of ±10° relative to the direction <110> or the direction equivalent thereto, the longitudinal direction of the reflection preventive membrane or the reflection membrane can be set with ease, the epitaxial growing direction of single crystals can be directed to the direction in which the growing speed inherent to the crystal face is larger and to the direction of arranging the devices and, since the single crystal growing distance per one scanning of the argon laser beams is reduced a single crystalline semiconductor layer with a large area and at a high quality can be obtained in a shorter period of time with no occurrence of crystal defects.

What is claimed is:

1. A method of manufacturing a semiconductor crystalline layer comprising the following steps:
    a first step of forming, on a single crystalline substrate composed of a semiconductor having a main face on (001) face or crystal face equivalent thereto and having a diamond-type crystal structure, an orientation flat face in which the direction of the intersection with said main face makes an angle within a range of from about 30 degrees to about 45 degrees relative to the direction <110> or the direction equivalent thereto on said main face and which serves as a reference for defining the direction of arranging semiconductor chips formed on said substrate;
    a second step of forming, on the main face of said substrate, and insulation layer at least a portion of which has an opening reaching said main face and which insulates the atmosphere on the side of the surface of said single crystalline substrate at a region other than the opening;
    a third step of forming a semiconductor layer composed of a polycrystalline or amorphous semiconductor on the entire surface of said opening and said insulation layer;
    a fourth step of forming a reflectivity varying layer which is in a direction substantially parallel with or perpendicular to the interstation between said orientation flat face and said main face, and which has a width and a spacing in a range and is made of a material having periodic reflectivity variation to laser beams; and
    a fifth step of scanning said laser beams under continuous irradiation by way of said reflectivity varying layer to said semiconductor layer in the direction identical with or at an angle within a range of about plus or minus 10 degrees relative to the direction <110> of said main face or the direction equivalent thereto.

2. A manufacturing method as defined in claim 1, wherein the first step forms the orientation flat face such that the intersection with the main surface of the single crystalline substrate is in the direction <510> on the main face or the direction equivalent thereto.

3. A manufacturing method as defined in claim 1, wherein the fourth step includes a step of forming a silicon dioxide membrane of from 2000 to 3000 Å thickness to the surface of the semiconductor layer formed by the third step and a step of forming a silicon nitride membrane of from 400 to 800 Å thickness with the width from 8 to 15 μm and the interval from 4 to 7 μm in a stripe-like manner at the surface of the silicon dioxide membrane.

4. A manufacturing method as defined in claim 1, wherein the fourth step includes a step of forming a first reflection preventive membrane made of silicon dioxide of 100 to 200 Å thickness to the surface of the semiconductor layer, a step of forming a second reflection preventive membrane made of silicon nitride membrane with of 500 to 600 Å thickness and the width of 4 to 7 μm, and the interval of 8 to 15 μm in a stripe-like manner to the surface of said first reflection preventive membrane and a step of forming third reflection membrane made of silicon nitride membrane of 60 to 150 Å thickness to the surface of said first and second reflection preventive membranes.

5. A manufacturing method as defined in claim 4, wherein the second reflection preventive membrane formed in a stripe-like shape is set such that the longitudinal direction for each of the stripes thereof is set in the direction <510> of the main face of the substrate so as to be vertical to and/or parallel with orientation flat face formed on said substrate and such that the reflectivity of the silicon dioxide of the first reflection prevention membrane to the argon laser beams upon undergoing the laser irradiation is varied periodically.

6. A manufacturing method as defined in claim 1, wherein the single crystalline substrate is made of a single crystalline silicon wafer and the semiconductor layer formed in the third step is made of polycrystalline or amorphous silicon, and said polcrystalline or amorphous silicon is recrystallized into single crystal silicon initiated from the single crystal silicon of said substrate as the seeds by irradiating and scanning the argon laser beams in the fifth step.

7. A method of manufacturing a semiconductor crystalline layer as defined in claim 1, wherein said single crystalline substrate is composed of a semiconductor constituted by a single silicon wafer; and the polycrystalline or amorphous semiconductor layer has a thickness of 4000 Å to 7000 Å and is composed of either polycrystalline or amorphous silicon layered and formed on said wafer, and said polycrystalline or amorphous silicon is recrystallized to a single crystal silicon with said wafer being applied as a seed wafer.

8. A method of manufacturing a semiconductor crystalline layer as defined in claim 7, wherein said polycrystalline or amorphous silicon is formed to have a thickness of 5000 Å.

* * * * *

UNITED STATES PATENT AND TRADEMARK OFFICE
CERTIFICATE OF CORRECTION

PATENT NO. : 4,861,418

DATED : August 29, 1989

INVENTOR(S) : Tadashi Nishimura et al.

It is certified that error appears in the above-identified patent and that said Letters Patent is hereby corrected as shown below:

Column 2, line 53, delete the word "to".

Column 3, line 23, the word "extent" should be --extend--.

Column 9, line 61, after the word "as" insert the word --to--.

Signed and Sealed this

Nineteenth Day of February, 1991

Attest:

HARRY F. MANBECK, JR.

*Attesting Officer*       *Commissioner of Patents and Trademarks*